United States Patent
Uematsu et al.

(10) Patent No.: US 8,680,881 B2
(45) Date of Patent: Mar. 25, 2014

(54) TEST METHOD AND INTERPOSER USED THEREFOR

(76) Inventors: Yutaka Uematsu, Chiyoda-ku (JP); Hideki Osaka, Chiyoda-ku (JP); Satoshi Nakamura, Chiyoda-ku (JP); Satoshi Muraoka, Chiyoda-ku (JP); Mitsuaki Katagiri, Chuo-ku (JP); Ken Iwakura, Chuo-ku (JP); Yukitoshi Hirose, Chuo-ku (JP)

( * ) Notice: Subject to any disclaimer, the term of this patent is extended or adjusted under 35 U.S.C. 154(b) by 544 days.

(21) Appl. No.: 13/044,717

(22) Filed: Mar. 10, 2011

(65) Prior Publication Data

US 2011/0234249 A1  Sep. 29, 2011

(30) Foreign Application Priority Data

Mar. 23, 2010  (JP) .................................. 2010-066543

(51) Int. Cl.
*G01R 31/00*  (2006.01)

(52) U.S. Cl.
USPC .............. 324/754.18; 438/9; 438/11; 438/14; 438/17; 438/19; 324/762; 257/48

(58) Field of Classification Search
USPC .................... 324/754.18; 438/9, 11
See application file for complete search history.

(56) References Cited

U.S. PATENT DOCUMENTS

| | | | |
|---|---|---|---|
| 7,808,258 B2 * | 10/2010 | Mangrum et al. | 324/754.18 |
| 8,058,887 B2 * | 11/2011 | Tunaboylu | 324/754.18 |
| 8,384,411 B2 * | 2/2013 | Mooyman-Beck et al. | 324/762.02 |
| 2002/0137238 A1 * | 9/2002 | Mockel et al. | 438/14 |
| 2003/0104641 A1 * | 6/2003 | Kohno et al. | 438/14 |
| 2003/0129775 A1 * | 7/2003 | Kline | 438/14 |
| 2004/0175850 A1 * | 9/2004 | Shimizu et al. | 438/14 |
| 2004/0235207 A1 * | 11/2004 | Kasukabe et al. | 438/14 |
| 2005/0093557 A1 * | 5/2005 | Akram | 324/754 |
| 2005/0156165 A1 * | 7/2005 | Eldridge et al. | 257/48 |
| 2006/0040417 A1 * | 2/2006 | Eldridge et al. | 438/14 |
| 2007/0077667 A1 * | 4/2007 | Oishi | 438/14 |
| 2007/0259456 A1 * | 11/2007 | Gritters | 438/14 |
| 2008/0100323 A1 * | 5/2008 | Mayder | 324/761 |
| 2008/0206903 A1 * | 8/2008 | Chan et al. | 438/14 |
| 2008/0265922 A1 * | 10/2008 | Eldridge et al. | 324/754 |
| 2011/0121848 A1 * | 5/2011 | Komoto et al. | 324/754.18 |
| 2011/0148456 A1 * | 6/2011 | Mooyman-Beck et al. | 324/762.02 |

FOREIGN PATENT DOCUMENTS

JP  2007-085741 A  4/2007

* cited by examiner

*Primary Examiner* — Benjamin M Baldridge
(74) *Attorney, Agent, or Firm* — Sughrue Mion, PLLC

(57) ABSTRACT

An interposer to be mounted with an integrated circuit to be a test object is provided with a switch and a probe to detect an electric current corresponding to individual terminals of the integrated circuit. A test pattern signal is then inputted to the integrated circuit through a test substrate as a switch that is connected to a power supply terminal of the integrated circuit and that is turned off. If the integrated circuit normally operates and the current values of all the terminals of the integrated circuit are within a tolerance, the power supply terminal connected to the turned-off switch is identified as a terminal that may be removed.

7 Claims, 6 Drawing Sheets

TEST METHOD AND INTERPOSER USED THEREFOR

BACKGROUND OF THE INVENTION

1. Field of Invention

The present invention relates to a test method for integrated circuits and an interposer used therefor.

2. Description of Related Art

For test methods for integrated circuits (IC), the MP method (IEC 61967-6), the VDE method (IEC 61967-4), and the like, which are defined according to the IEC (International Electrotechnical Commission), for example, are known. The MP and VDE methods are methods of measuring IC power current for evaluation. In addition, Japanese Patent Laid-Open No. 2007-085741 discloses a technique that evaluates noise emitted from a casing, in which electric current that flows through screws that fix a substrate to the casing and electric current that leaks from the substrate to the casing are determined and individually measured.

Now, in recent ICs, the number of terminals of the IC package tends to increase with the increase in multifunctionality and high density. On the other hand, there is also a requirement that the size of the IC package be reduced. BGA (Ball Grid Array) packages are known as an IC package that allows terminals to be packaged in high density. However, even for BGA packages, there are limitations governing the amount of terminals that can be included in a high density layout, and the requirement is that unnecessary terminals be eliminated.

ICs generally include pluralities of power supply terminals and ground terminals. However, because the test method of the Related Art cannot measure electric currents flowing through the individual terminals of the BGA package, for example, extra power supply terminals or ground terminals are sometimes provided, based on simulation results of current that is consumed, or the like.

The foregoing MP and VDE methods are methods of measuring the current consumption of the overall IC, but are not methods used for measuring electric currents flowing through individual terminals. Furthermore, although the technique described in Japanese Patent Laid-Open No. 2007-085741 can measure electric currents flowing through individual screws, the technique cannot measure electric currents flowing through individual terminals of the BGA package. Moreover, the technique described in Japanese Patent Laid-Open No. 2007-085741 cannot identify terminals that may be removed from the IC.

SUMMARY

In one embodiment, there is provided a test method that includes: connecting an integrated circuit to a test substrate through an interposer, the test substrate being configured to supply electric power and a test pattern signal to the integrated circuit, and the interposer having a probe configured to detect an electric current flowing through an individual terminal of the integrated circuit and a switch connected to the individual terminal in series; supplying and inputting the electric power and the test pattern signal to the integrated circuit through the test substrate after turning off at least one switch connected to an individual terminal for power supply of the integrated circuit; acquiring a processed result processed by the integrated circuit according to the test pattern signal; measuring an electric current flowing through the individual terminal of the integrated circuit and determining whether a current value of the measured electric current is within a preset tolerance, while the integrated circuit is performing processing according to the test pattern signal; determining whether the processed result that is realized by the integrated circuit is correct; and determining that the individual terminal for power supply connected to the switch that is turned off in the inputting step is a terminal that may be removed from the integrated circuit, if it is determined that the processed result is correct in the processed result determining step and if it is determined that the current value of the electric current flowing through the individual terminal for power supply of the integrated circuit is within the preset tolerance in the current value determining step.

According to the foregoing test method, the electric currents flowing through the individual terminals are measured separately. If the electric current flowing through the terminal for the power supply does not exceed the preset tolerance and if the integrated circuit that is a test object operates normally, it is thought that the integrated circuit will operate normally even when the terminal for power supply connected to the switch that is turned off is removed. Accordingly, it is possible to remove the terminal for the power supply connected to the switch that is turned off. More specifically, it is possible to identify a terminal that is removable from the integrated circuit.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENT

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
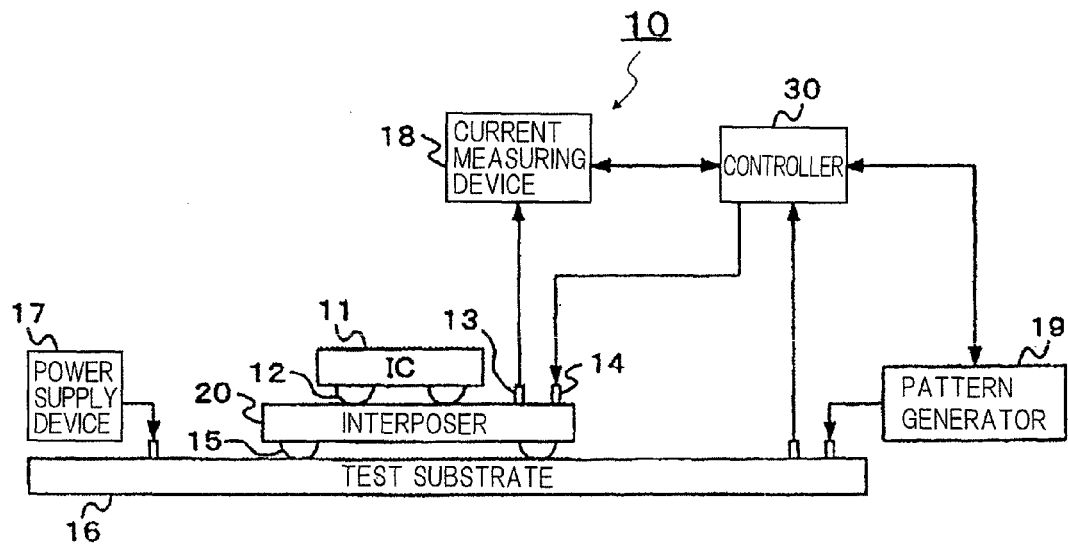
FIG. 1 is a block diagram depicting an exemplary configuration of a test system according to the present invention.

FIG. 1 is a block diagram depicting an exemplary configuration of a test system according to the present invention.

As shown in FIG. 1, test system 10 according to the present invention includes test substrate 16, power supply device 17, current measuring device 18, pattern generator 19, interposer 20, and controller 30.

As shown in FIG. 1, IC 11 in a BGA package, which is a test object, is mounted on interposer 20 through BGA balls 12. Interposer 20 is mounted on test substrate 16 through BGA balls 15. It is possible to connect interposer 20 to test substrate 16 using connection means, pins in PGA (Pin Grid Array), for example, other than BGA balls 15.

Interposer 20 has, for each of BGA balls 12 of IC 11, a pad connected to BGA ball 12, a through hole penetrated from the side on which IC 11 is mounted to the side that faces test substrate 16, the through hole being connected to the pad, and a switch that connects or disconnects the through hole to or from BGA ball 15. Each switch is connected to control terminal 14 disposed on interposer 20, and connects or disconnects the through hole to or from BGA ball 15 according to control signals supplied from controller 30 through control terminal 14. Furthermore, each through hole is provided with a probe that detects an electric current flowing through the through hole. The probe detects an electric current flowing through the through hole and outputs a detected signal, that corresponds to the electric current, to current measuring device 18 through monitor terminal 13 disposed on interposer 20.

Test substrate 16 is supplied with electric power (power) from power supply device 17, and supplies electric power (power) to IC 11 through interposer 20. Moreover, test substrate 16 is inputted with preset test pattern signals (referred to as test signals below) from pattern generator 19, and supplies the test signals to IC 11 through interposer 20. Moreover, test substrate 16 receives processed results that are processed by IC 11 according to the test signals through interposer 20, and outputs the results to controller 30.

Current measuring device 18 receives signals detected by the individual probes disposed on interposer 20 through monitor terminal 13, converts the signals to current values, and outputs the converted current values to controller 30 along with pieces of information individually indicating BGA balls 12 connected to the through holes having the corresponding probes.

When pattern generator 19 is instructed by controller 30 that a test begins, it supplies preset test signals to IC 11 through test substrate 16 and interposer 20. Furthermore, when finishing the supply of the test signals, pattern generator 19 notifies this information to controller 30. Furthermore, when pattern generator 19 is instructed by controller 30 that the test has been terminated, it stops the supply of the test signals. The operations of controller 30 will be described later.

Figure 2:
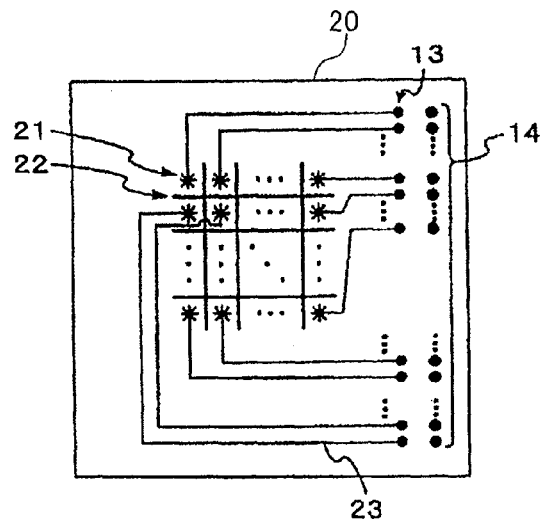
FIG. 2 is a plan view depicting an example of one side of the interposer shown in FIG. 1, on which an IC is mounted.
Figure 3:
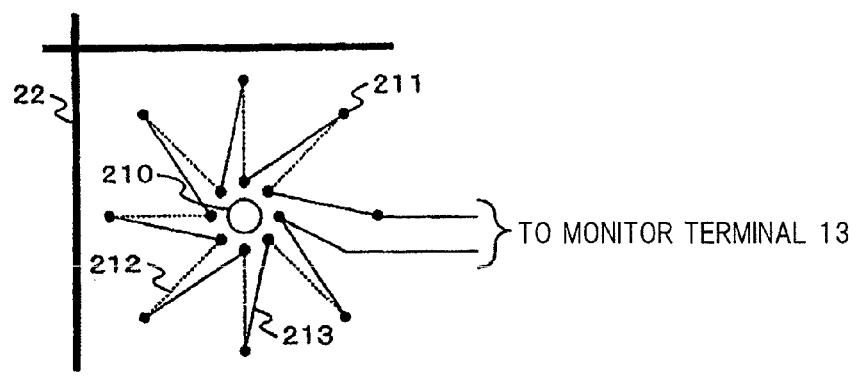
FIG. 3 is a plan view depicting an enlarged essential part of one side of the interposer shown in FIG. 2.

FIG. 2 is a plan view depicting one example of one side of the interposer shown in FIG. 1, on which an IC is mounted. FIG. 3 is a plan view depicting an enlarged essential part of one side of the interposer shown in FIG. 2.

As shown in FIG. 2, interposer 20 has a flat plate shape, and has pads on one side, on which the BGA balls 12 of IC 11 are mounted. Regions 21 in which pads are individually disposed are each separated by shields 22 that are formed of a conductor penetrated from one side to the other side of interposer 20.

An enlarged diagram depicting region 21 separated by shields 22 is shown in FIG. 3.

As shown in FIG. 3, region 21 is disposed with pad 210, on which the BGA ball 12 of IC 11 is mounted, and pad 210 is connected with a through hole that penetrates from one side, that has pad 210, to the other side. Moreover, a plurality of wiring patterns 213 is connected around pad 210. In addition, wiring patterns 212 indicated by dotted lines shown in FIG. 3 depict wires disposed on the other side that faces to test substrate 16.

Figure 5:
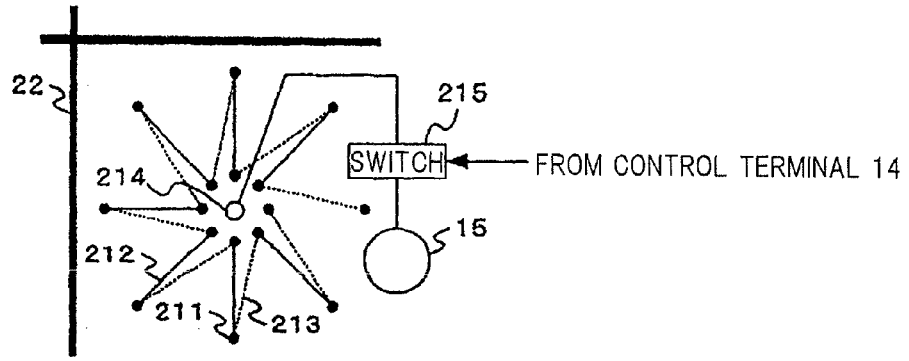
FIG. 5 is a plan view depicting an enlarged essential part of the other side of the interposer shown in FIG. 4.

Wiring patterns 213 provided on one side, on which pad 210 is disposed, are connected to wiring patterns 212 provided on the other side, via through holes 211, and a coil is formed so as to surround through hole 214 (see FIG. 5). The coil is used for a probe that detects an electric current flowing through hole 214. In this configuration, when an electric current flows through hole 214, a magnetic field corresponding to the current value of the electric current is produced to cause induced voltages at both ends of the coil in linkage with the magnetic field. The voltages induced at both ends of the coil are outputted to current measuring device 18 through monitor terminal 13. Current measuring device 18 converts the voltages inputted through monitor terminal 13 into current values, and outputs the values to controller 30.

Figure 4:
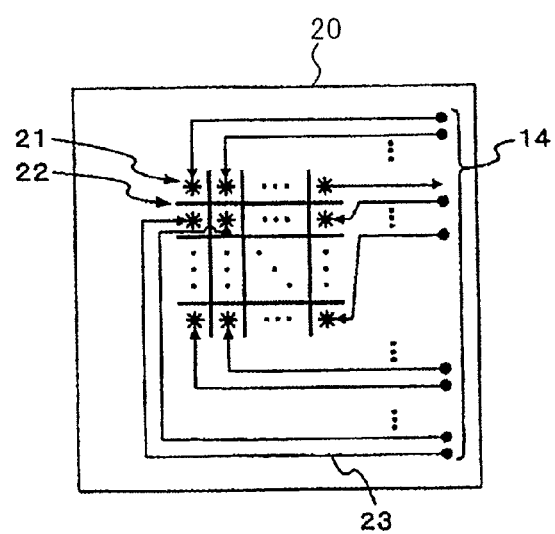
FIG. 4 is a plan view depicting an example of the other side of the interposer shown in FIG. 1, the other side facing to a test substrate.

FIG. 4 is a plan view depicting an example of the other side of the interposer shown in FIG. 1, the other side facing to the test substrate. FIG. 5 is a plan view depicting an enlarged essential part of the other side of the interposer shown in FIG. 4.

As shown in FIG. 5, the other side of interposer 20 is disposed with through hole 214 that penetrates from the other side to the one side, on which IC 11 is mounted.

As shown in FIG. 5, through hole 214 is connected with switch 215. Switch 215 connects or disconnects through hole 214 to or from BGA ball 15 (see FIG. 1) that connects to test substrate 16, according to control signals supplied from controller 30 through control terminal 14. In addition, wiring patterns 213 indicated by dotted lines shown in FIG. 5 depict wires disposed on one side, on which IC 11 is mounted.

Figure 6:
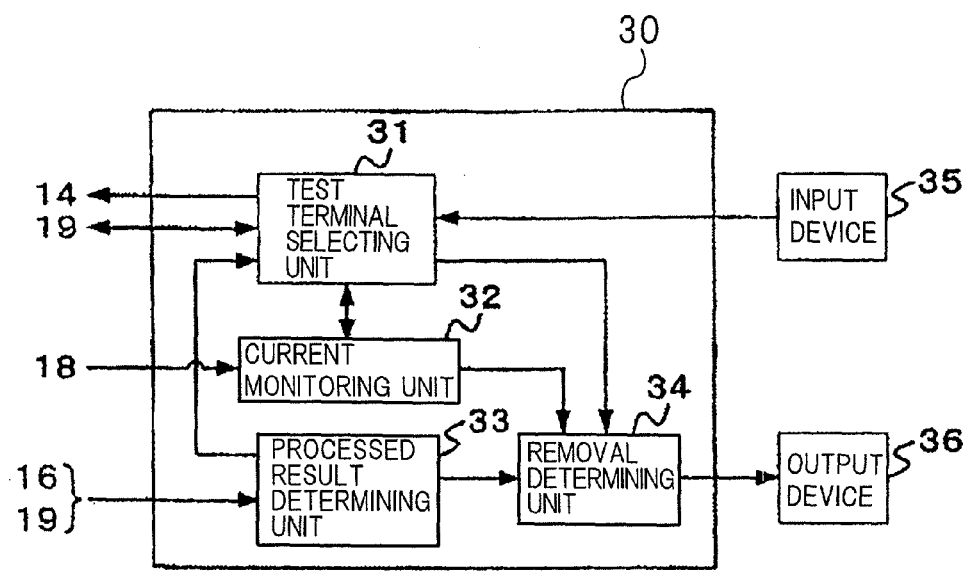
FIG. 6 is a block diagram depicting an exemplary configuration of a controller shown in FIG. 1.

FIG. 6 is a block diagram depicting an exemplary configuration of controller 30 shown in FIG. 1.

As shown in FIG. 6, controller 30 has test terminal selecting unit 31, current monitoring unit 32, processed result determining unit 33, and removal determining unit 34.

It is possible to implement controller 30 by an input/output interface and a computer, for example. The input/output interface is one that is connected to input device 35 to input data and instructions made by a user and that is connected to output device 36 to output processed results processed through controller 30, and the computer is one that includes a communication device to communicate with other devices.

When test terminal selecting unit 31 is instructed by a user that a test begins, using input device 35 such as a keyboard, it selects one or more of the power supply terminals (or ground terminals) of IC 11, which are test subjects, and supplies, to interposer 20 through control terminal 14, control signals to turn off the switch connected to the selected power supply terminal. Furthermore, test terminal selecting unit 31 instructs pattern generator 19 to start to supply test signals, and notifies removal determining unit 34 of information that identifies the selected power supply terminal.

Moreover, if test terminal selecting unit 31 is notified from current monitoring unit 32 that the current value of an electric current flowing through the power supply terminal (or ground terminal) exceeds a tolerance, or if it is notified from processed result determining unit 33 that IC 11 is not operating normally, it instructs pattern generator 19 to stop supplying the test signals.

In addition, if there are combinations of unselected power supply terminals, test terminal selecting unit 31 newly selects one or more of the power supply terminals of IC 11, which are test subjects, supplies control signals to interposer 20 through control terminal 14, instructs pattern generator 19 to start to supply test signals, and notifies removal determining unit 34 of information to identify the selected power supply terminal.

If test terminal selecting unit 31 is notified from pattern generator 19 that supplying the test signals is finished, in the absence of notification from current monitoring unit 32 that the current value exceeds the tolerance, it newly selects one or more of the power supply terminals of IC 11, which are test subjects, and supplies control signals to interposer 20 through control terminal 14. Test terminal selecting unit 31 then instructs pattern generator 19 to start to supply test signals, and notifies removal determining unit 34 of information for identifying the selected power supply terminal. In addition, when pattern generator 19 is instructed to start to supply test signals from test terminal selecting unit 31, it sequentially supplies predetermined test signals to IC 11, according to a preset sequence.

Current monitoring unit 32 determines whether the current value of each terminal supplied from current measuring device 18 is within the tolerance preset to each terminal. If the current value supplied from current measuring device 18 exceeds the preset tolerance, current monitoring unit 32 notifies test terminal selecting unit 31 and removal determining unit 34 that the preset tolerance has been exceeded.

Processed result determining unit 33 receives a processed result (expected value) to be outputted by IC 11 according to the test signal supplied from pattern generator 19. In addition, processed result determining unit 33 acquires a processed result processed by IC 11 for the test signal from test substrate 16, and compares the processed result with the expected value received from pattern generator 19 to determine whether IC 11 normally operates.

If processed result determining unit 33 determines that IC 11 is not operating normally, it notifies test terminal selecting unit 31 and removal determining unit 34, at that point, that IC 11 is not operating normally. On the other hand, if processed result determining unit 33 determines that IC 11 is operating normally until it receives notification from pattern generator 19 that supplying the test signals is finished, it notifies removal determining unit 34 that IC 11 is operating normally at the point, at which it is notified from pattern generator 19, that supplying the test signals is finished.

When removal determining unit 34 is notified from processed result determining unit 33 that IC 11 is operating normally with no notification from current monitoring unit 32 that the current value exceeds the tolerance, after receiving notification of identification information about the power supply terminal from test terminal selecting unit 31, it causes output device 36 such as a display or printer to output a message that the power supply terminal corresponding to the identification information may be removed from IC 11.

On the other hand, if removal determining unit 34 is notified from current monitoring unit 32 that the current value exceeds the tolerance, or if it is notified from processed result determining unit 33 that IC 11 is not operating normally, after receiving notification of identification information about the power supply terminal from test terminal selecting unit 31, it causes output device 36 to output a message that the power supply terminal corresponding to the identification information should not be removed from IC 11. At this time, it is possible that removal determining unit 34 causes output device 36 to output the maximum current value of the current flowing through the power supply terminal whose the current value exceeds the tolerance, or to output pieces of information such as test items on which IC 11 is not operating normally, along with information about the power supply terminal that is a test subject.

Figure 7:
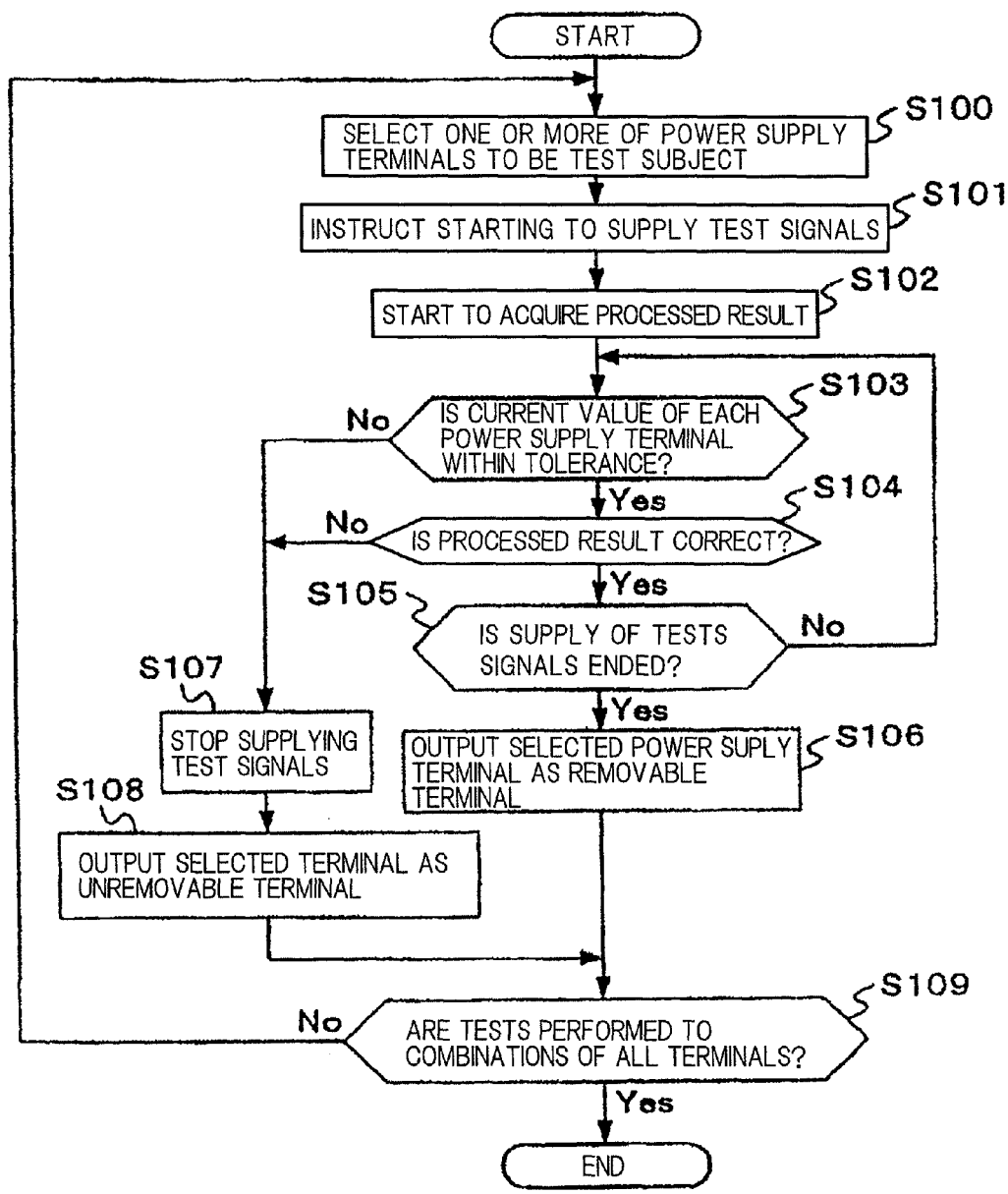
FIG. 7 is a flowchart depicting an exemplary operation of the controller shown in FIG. 1.

FIG. 7 is a flowchart depicting an exemplary operation of the controller shown in FIG. 1.

When controller 30 is instructed to start a test by the user through input device 35, it performs processing according to the flowchart shown in FIG. 7.

As shown in FIG. 7, controller 30 first selects one or more of the power supply terminals (or ground terminals) of IC 11, which are test subjects, by using test terminal selecting unit 31, and supplies control signals to turn off a switch connected to the selected power supply terminal, to interposer 20 through control terminal 14 (Step S100).

Furthermore, controller 30 instructs pattern generator 19 to start to supply test signals by using test terminal selecting unit 31, and notifies removal determining unit 34 of information to identify the selected power supply terminal (Step S101).

Subsequently, controller 30 acquires processed results by IC 11 according to the test signals by using processed result determining unit 33 (Step S102). Moreover, controller 30 determines by using current monitoring unit 32 whether the current value of each of the terminals supplied from current measuring device 18 is within a preset tolerance (Step S103).

If the current value supplied from current measuring device 18 exceeds the preset tolerance (Step S103: No), controller 30 notifies test terminal selecting unit 31 and removal determining unit 34 that the preset tolerance has been exceeded by using current monitoring unit 32. Test terminal selecting unit 31 instructs pattern generator 19 to stop supplying the test signals (Step S107), and processing goes to Step S109. Removal determining unit 34 causes output device 36 to output a message that the power supply terminal corresponding to the identification information notified from test terminal selecting unit 31 should not be removed from IC 11 (Step S108).

In Step S103, if the current value supplied from current measuring device 18 is within the preset tolerance (Step S103: Yes), processed result determining unit 33 compares the result processed by IC 11 according to the test signal with the expected value received from pattern generator 19, and determines whether IC 11 is operating normally (Step S104).

If IC 11 is not operating normally (Step S104: No), controller 30 notifies removal determining unit 34 by using processed result determining unit 33 that IC 11 is not operating normally, and again performs processing by using test terminal selecting unit 31 in Step S107.

If IC 11 is operating normally (Step S104: Yes), controller 30 determines by using processed result determining unit 33 whether pattern generator 19 is carrying out notification that supplying the test signals is finished (Step S105). If notification that supplying the test signals is finished is not made (Step S105: No), controller 30 again performs processing from Step S103.

If pattern generator 19 carries out notification that supplying the test signals is finished (Step S105: Yes), controller 30 notifies removal determining unit 34 by using processed result determining unit 33 that IC 11 is operating normally. Removal determining unit 34 causes output device 36 to output a message that the power supply terminal corresponding to the identification information notified from test terminal selecting unit 31 may be removed from IC 11 (Step S106).

Subsequently, controller 30 determines whether the combinations of all the power supply terminals are selected by using test terminal selecting unit 31 (Step S109).

If there is a combination of unselected terminals (Step S109: No), controller 30 again performs processing from Step S100. On the other hand, if the combinations of all the power supply terminals are selected (Step S109: Yes), controller 30 notifies removal determining unit 34 by using test terminal selecting unit 31 that the test is ended. Removal determining unit 34 causes output device 36 to output a message that the test is ended.

According to the embodiment, if electric currents flowing through the individual terminals are separately measured, the electric currents flowing through the terminals for power supply will not exceed the preset tolerance, and if the integrated circuit, which is a test object, is operating normally, the integrated circuit is deemed to be operating normally even when a terminal for power supply connected to a switch that is turned off is removed. Therefore, removing this terminal for power supply connected to the switch that is turned off is possible. More specifically, identifying a terminal that may be removed from the integrated circuit is possible.

In addition, in the foregoing description, for the probe to measure electric currents flowing through the individual terminals of IC 11, a coil is used, which is provided around the through hole connected to the terminal. However, the probe is not limited to the coil.

Figure 8:
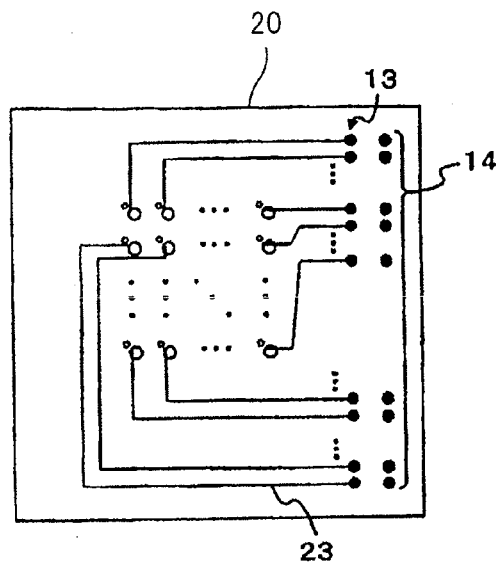
FIG. 8 is a plan view depicting another example of one side of the interposer shown in FIG. 1, on which an IC is mounted.
Figure 9:
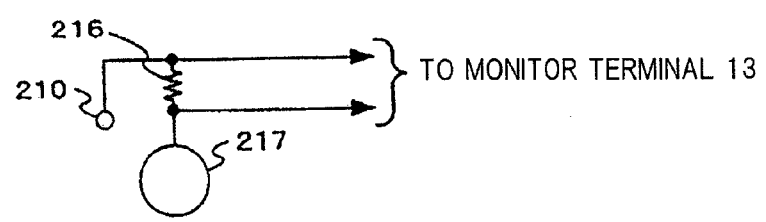
FIG. 9 is a plan view depicting an enlarged essential part of one side of the interposer shown in FIG. 8.

For example, as shown in FIGS. 8 and 9, it is possible that resistor 216 having several ohms is connected in series between pad 217 and through hole 210 disposed on one side of interposer 20, and voltages produced at both ends of resistor 216 are measured by current measuring device 18 through monitor terminal 13 for measuring electric currents flowing through pad 217 and through hole 210. In this case, resistor 216 is a probe.

Figure 10:
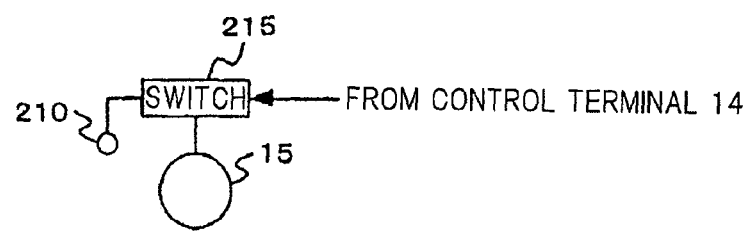
FIG. 10 is a plan view depicting another example of the other side of the interposer shown in FIG. 1, the other side facing to the test substrate.

Furthermore, at this time, it is possible to dispose switch 215 to connect or disconnect through hole 210 to or from BGA ball 15 (see FIG. 1) on the other side of interposer 20, as shown in FIG. 10.

It is likely that when coils are used for the probes to detect electric currents, each coil is subjected to the influence of magnetic fields produced by electric currents flowing through the other nearby through holes. On the other hand, when resistor 216 is used for the probe, the resistor is not affected by magnetic fields produced by electric currents flowing through the other through holes, thus it is unnecessary to surround each probe with shields. Therefore, it becomes possible to form interposer 20 more simply.

Figure 11:
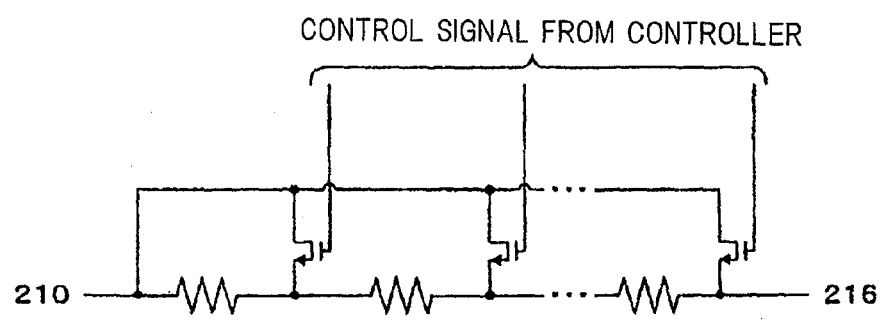
FIG. 11 is a circuit diagram depicting an exemplary configuration of a variable resistor mounted on one side of the interposer shown in FIG. 1.

Furthermore, it is possible to provide settings to increase the detection sensitivity of the electric current in such a way that a variable resistor may be used for resistor 216 shown in FIG. 9 and resistance values may be changed according to the current value of the electric current flowing through the power supply terminal. In this case, it is possible to form the variable resistor as shown in FIG. 11, for example. The variable resistor shown in FIG. 11 is an exemplary configuration in which switches (MOSFET) are turned on or off according to control signals from controller 30 to change resistance values.

Moreover, in the foregoing description, an exemplary configuration is shown in which individual regions 21 on interposer 20, on which BGA balls 12 of IC 11 are mounted, are separated with shields 22 on an individual basis (see FIGS. 2 to 5). However, it is possible to eliminate shields 22 if distances between the plurality of BGA balls 12 satisfy a predetermined condition.

Here, it is assumed that the condition for eliminating shields 22 is to satisfy expression (1) below $$b < 0.045a \quad (1)$$

where the diameter of a circle formed by a coil used for a probe is b, and the distance between the centers of the adjacent probes is a.

This shows the condition that, where two adjacent through holes are through holes A and B, a magnetic field that is to be produced when an electric current flows through hole A hardly affects the coil, that is provided around through hole B, uses to detect an electric current.

A derivation method for this conditional expression is as follows.

First, suppose that a coil provided around through hole B to detect a magnetic field surrounds through hole B in a circle having diameter b. If the distance between the centers of through holes A and B is a, the magnitude of a magnetic field, $H_1$, which a portion of the coil provided around through hole B close to through hole A that is received from through hole A, is expressed by expression (2) below $$H_1 = \mu I / \{2\pi(a - b/2)\} \quad (2)$$

where, $\mu$ is permeability, and I is the amount of current flowing through the through hole.

Furthermore, the magnitude of a magnetic field, $H_2$, which a portion of the coil provided around through hole B apart from through hole A that is received from through hole A, is expressed by expression (3) below $$H_2 = \mu I / \{2\pi(a + b/2)\} \quad (3)$$

Although magnetic fields $H_1$ and $H_2$ have the same orientation, the wound directions of the coil to detect these magnetic fields are reversed. Thus, the induced voltages produced at these portions have reverse polarities.

Moreover, it is necessary to detect an electric current, $I_{min} = I_{max}/100$, in order to detect the maximum electric current in a resolution of 1/100, where the maximum electric current that is to be detected is $I_{max}$. Therefore, in order for a coil to detect electric current with sufficient resolution, it is necessary that the difference between the magnitudes of magnetic fields $H_1$ and $H_2$ be smaller than the magnitude of a magnetic field that is to be produced when an electric current at about one digit smaller than $I_{min}$ flows. More specifically, it is necessary to satisfy relational expression (4) below $$H_1 - H_2 < \mu \times 0.001 \times I / (\pi b) \quad (4)$$

From these expressions (2) to (4), conditional expression (1) mentioned above is obtained.

Although the inventions has been described above in connection with several preferred embodiments thereof, it will be appreciated by those skilled in the art that those embodiments are provided solely for illustrating the invention, and should not be relied upon to construe the appended claims in a limiting sense.

The invention claimed is:

1. A test method comprising:
   connecting an integrated circuit to a test substrate through an interposer, said test substrate being configured to supply electric power and a test pattern signal to said integrated circuit, and said interposer having a probe configured to detect an electric current flowing through an individual terminal of said integrated circuit and a switch connected to said individual terminal in series;
   inputting and supplying the electric power and said test pattern signal to said integrated circuit through said test substrate after turning off at least one switch connected to an individual terminal for power supply of said integrated circuit;
   acquiring a processed result processed by said integrated circuit according to said test pattern signal;
   measuring an electric current flowing through said individual terminal of said integrated circuit;
   determining whether a current value of the measured electric current is within a preset tolerance, while said integrated circuit is performing processing according to said test pattern signal;

determining whether said processed result that is realized by said integrated circuit is correct; and determining that the individual terminal for power supply connected to the switch that is turned off in the inputting step is a terminal that may be removed from said integrated circuit, if it is determined that said processed result is correct in the processed result determining step and if it is determined that the current value of the electric current flowing through the individual terminal for power supply of said integrated circuit is within the preset tolerance in the current value determining step.

2. The test method according to claim 1, wherein in the inputting step, a connecting or disconnecting state of a switch is changed, or a connecting or disconnecting state of a combination of switches is changed, in the switches connected to the individual terminals for power supply of said integrated circuit, and wherein the acquiring step, the processed result determining step, the current value determining step, and the removal determining step are repeated.

3. The test method according to claim 1, wherein in the current value determining step, if it is determined that a current value of an electric current flowing through any one of said individual terminals of said integrated circuit exceeds the preset tolerance, inputting the electric power and said test pattern signal to said integrated circuit is stopped.

4. A test system comprising:
an interposer having a probe configured to detect an electric current flowing through an individual terminal of an integrated circuit and a switch connected to said individual terminal in series, the interposer being mounted with said integrated circuit to be a test object;
a power supply device supplying electric power to said integrated circuit;
a pattern generator generating a predetermined test pattern signal to be supplied to said integrated circuit;
a current measuring device measuring an electric current flowing through said individual terminal of said integrated circuit using said probe;
a test substrate supplying the electric power and said test pattern signal to said integrated circuit through said interposer, the test substrate being mounted with said interposer; and
a controller comprising:
a test terminal selecting unit turning off at least one switch connected to an individual terminal for power supply of said integrated circuit and supplying and stopping the electric power and said test pattern signal to said integrated circuit,
a current monitoring unit determining whether the measured electric current flowing through said individual terminal of said integrated circuit by said current measuring device is within a preset tolerance, while said integrated circuit is performing processing according to said test pattern signal,
a processed result determining unit acquiring a processed result processed by said integrated circuit according to said test pattern signal and determining whether said processed result that is realized by said integrated circuit is correct, and
a removal determining unit determining that the individual terminal for power supply connected to the switch that is turned off by said test terminal selecting unit is a terminal that may be removed from said integrated circuit, if said processed result determining unit determines that said processed result is correct and if said current monitoring unit determines that the current value of the electric current flowing through the individual terminal for power supply of said integrated circuit is within the preset tolerance.

5. The test system according to claim 4, wherein said probe of said interposer is a coil formed so as to surround a through hole disposed on a substrate, and
wherein said switch connects or disconnects said through hole to or from said individual terminal of said integrated circuit.

6. The test system according to claim 5, wherein said interposer comprises a shield formed of a conductor that surrounds said coil.

7. The test system according to claim 4, wherein said probe is a resistor connected to a through hole disposed on a substrate in series, and
wherein said switch connects or disconnects said through hole to or from said individual terminal of said integrated circuit through said resistor.

* * * * *